United States Patent [19]

Estrada

[11] Patent Number: 5,101,124
[45] Date of Patent: Mar. 31, 1992

[54] ECL TO TTL TRANSLATOR CIRCUIT WITH IMPROVED SLEW RATE

[75] Inventor: Julio R. Estrada, South Portland, Me.

[73] Assignee: National Semiconductor Corporation, Santa Clara, Calif.

[21] Appl. No.: 639,793

[22] Filed: Jan. 10, 1991

[51] Int. Cl.$^5$ ............................ H03K 19/003
[52] U.S. Cl. .............................. 307/475; 307/443; 307/455; 307/456
[58] Field of Search ............... 307/475, 455, 456, 443

[56] References Cited

U.S. PATENT DOCUMENTS

| | | | |
|---|---|---|---|
| 4,527,079 | 7/1985 | Thompson | 307/475 |
| 4,644,194 | 2/1987 | Birrittella et al. | 307/475 |
| 4,678,942 | 7/1987 | Kanai et al. | 307/455 |
| 4,912,344 | 3/1990 | Yin | 307/443 |
| 4,988,898 | 1/1991 | Jansson | 307/475 |
| 4,992,681 | 2/1991 | Urakawa et al. | 307/475 |
| 4,999,519 | 3/1991 | Kitsukawa et al. | 307/455 |
| 5,015,888 | 5/1991 | Ovens | 307/475 |

*Primary Examiner*—Stanley D. Miller
*Assistant Examiner*—Scott A. Ouellette
*Attorney, Agent, or Firm*—James W. Rose; Daniel H. Kane

[57] ABSTRACT

An ECL to TTL translator circuit incorporates an ECL input gate, a TTL output gate, and a voltage amplifier transistor element circuit coupled between the ECL input gate and TTL output gate for effecting the translation. The ECL gate has differential ECL inputs for receiving ECL input signals at least at one of the ECL inputs ($V_{IN}$) and differential first and second ECL output nodes (A, B). First and second emitter follower output circuits (Q7, Q3) are coupled to the respective first and second ECL output nodes (A, B). The TTL gate (12) has a TTL output ($V_{OUT}$) for delivering TTL output signals corresponding to ECL input signals. The TTL gate phase splitter transistor element (Q9) controls the TTL output ($V_{OUT}$). The collector node of a voltage amplifier transistor element (Q6) is coupled to a base node of the phase splitter transistor element (Q9) for controlling the conducting state of the phase splitter transistor element out of phase with the voltage amplifier transistor element. The first emitter follower output circuit (Q7, Q8, R4) is coupled to the base node (C) of voltage amplifier transistor element (Q6) and the second emitter follower output circuit (Q3, Q4, R3) is coupled to the collector node (D) of the voltage amplifier transistor element (Q6) for controlling the conducting state of (Q6) in accordance with ECL input signals and for effecting translation with improved output switching speed.

16 Claims, 3 Drawing Sheets

ECL TO TTL TRANSLATOR CIRCUIT WITH IMPROVED SLEW RATE

TECHNICAL FIELD

This invention relates to a new emitter coupled logic (ECL) to transistor-transistor logic (TTL) translator circuit for delivering TTL output signals in response to ECL input signals. The invention increases the speed of translation and voltage level shift from ECL to TTL operating ranges.

BACKGROUND ART

A prior art ECL to TTL translator circuit is illustrated in FIG. 1. Differential ECL input signals at the ECL differential inputs $V_{IN}$, $V_{IN}$ are translated to single ended TTL output signals at the single ended TTL output $V_{OUT}$. Translation is achieved using a current mirror circuit QB,QA coupled between an ECL input gate Q1,Q2,R1,R2,I0 and a TTL output gate Q9,PULLUP,QLOP, R6,R7. The differential ECL input signals control the conducting states of ECL gate transistor elements Q1,Q2 in opposite phase. Tail current generated by current sink I0 passes alternately through the Q1.Q2 collector paths and swing resistors R1,R2 respectively coupled to the high potential power rail $V_{CC}$. Collector nodes A,B provide differential ECL output nodes coupled to first and second emitter follower output transistor elements Q7,Q3.

The first emitter follower transistor element Q7 provides a first emitter follower output circuit or network incorporating a first stack of voltage drop components Q8,R4,QB. Base collector shorted (BCS) transistor element QB provides the first branch or master branch of the current mirror circuit. The second emitter follower transistor element Q3 provides a second emitter follower output circuit or network incorporating a second stack of voltage drop components Q4,R3,D3 defining a switching control node D, and current sink transistor element QA. Current sinking transistor element QA is coupled in current mirror configuration with BCS transistor element QB and provides the second branch or slave branch of the current mirror.

Switching control node D in the second emitter follower output circuit is coupled to the base node of TTL gate phase splitter transistor element Q9. Current mirror current sink transistor element QA and the first and second emitter follower output circuits effect the translation by controlling the conducting state of phase splitter transistor element Q9 at switching control node D.

With an ECL low potential level signal at the input $V_{IN}$, ECL gate transistor element Q2 is off, and the base node B of the second emitter follower transistor element Q3 is pulled up to the high potential rail $V_{CC}$. Q3 conducts and the second emitter follower output circuit component elements Q3,Q4,R3 pullup the switching control node D at the base of phase splitter transistor element Q9. With Q9 conducting, a TTL low potential signal appears at the output $V_{OUT}$.

At the same time, ECL gate transistor element Q1 is on pulling down the potential at the base node A of the first emitter follower transistor element Q7. The current in the first emitter follower output circuit and current mirror master branch transistor element QB is at its lowest magnitude. Current sink transistor element QA mirrors this lower magnitude current. Resistor element R5 is a bleed resistor across the base and emitter nodes of QA.

With an ECL high potential level signal at input $V_{IN}$, ECL gate transistor element Q2 is on, pulling down the base node B of emitter follower output transistor element Q3. The second emitter follower output circuit components Q3,Q4,R3 no longer pull up the switching control node D. With a high potential level at the base node A of first emitter follower transistor element Q7, the current in the first emitter follower output circuit is at its highest magnitude. The larger current in master branch transistor element QB is reflected in current mirror transistor element QA with a larger sinking current. The base node D of phase splitter transistor element Q9 is pulled low and a TTL high potential level signal appears at the output $V_{OUT}$.

A disadvantage of the prior art ECL to TTL translator circuit of FIG. 1 is that current sink transistor element QA takes some of the sourcing current from the second emitter follower output circuit components slowing the turn on of phase splitter transistor element Q9. Furthermore, during turn off of the phase splitter Q9, the sinking current through current sink transistor element QA is limited by the current mirror current set by QB. The current mirror translator limits speed of translation and the switching speed or slew rate at the output.

OBJECTS OF THE INVENTION

It is therefore an object of the present invention to provide a new ECL to TTL translator circuit with increased speed of translation and improved slew rate at the output.

Another object of the invention is to provide a translator circuit with improved current sourcing and charging at the base of the phase splitter transistor element at the TTL output gate for faster turn on of the phase splitter.

Similarly, an object of the invention is to provide greater sinking current for discharging the base of the phase splitter transistor element and faster turn off of the phase splitter transistor element.

DISCLOSURE OF THE INVENTION

In order to accomplish these results the invention provides an ECL to TTL translator circuit with an ECL input gate having differential ECL inputs for receiving ECL input signals of high and low potential levels at least at one of ECL inputs. The ECL input gate is also provided with differential first and second ECL output nodes. First and second emitter follower output circuits are coupled to the respective first and second ECL output nodes. A TTL gate delivers TTL output signals at a TTL output corresponding to ECL input signals received at least at one of the ECL inputs. A phase splitter transistor element of the TTL gate is coupled to control the TTL output according to the conducting state of the phase splitter transistor element.

According to the present invention a voltage amplifier transistor element instead of a current mirror provides the translation from the ECL input gate to the TTL output gate. A collector node of the voltage amplifier transistor element is coupled to a base node of the phase splitter transistor element for controlling the conducting state of the phase splitter transistor element out of phase with the voltage amplifier transistor element. The first emitter follower output circuit is coupled to a base node of the voltage amplifier transistor element while the second emitter follower output circuit is coupled to the collector node of the voltage amplifier transistor element. The first and second emitter follower output circuits thereby control the conducting state of the voltage amplifier transistor element in accordance with ECL input signals.

The first emitter follower output circuit incorporates a first stack of voltage drop component elements defining a first switching control node coupled to the base node of the voltage amplifier transistor element. The second emitter follower output circuit incorporates a second stack of voltage drop component elements with the collector and emitter nodes of the voltage amplifier transistor element coupled in the second stack. The second stack of voltage drop component elements define at the collector node of the voltage amplifier transistor element a second switching control node coupled to the base node of the phase splitter translator element.

An advantage of the voltage amplifier transistor element translator over the current mirror translator is that the voltage amplifier transistor element provides a larger sinking current in the second emitter follower output circuit that is B times its base drive for faster discharge and turn off of the phase splitter transistor element. Furthermore the voltage amplifier transistor element can be completely turned off so that it does not divert sourcing current in the second emitter follower output circuit for faster charging and turn on of the phase splitter transistor element.

The TTL gate includes a lower output pulldown transistor element having base and emitter nodes coupled between an emitter node of the phase splitter transistor element and the low potential power rail. According to another feature of the invention a Miller killer transistor element is provided with collector and emitter nodes coupled between the base node of the lower output pulldown transistor element and the low potential power rail. The first stack of voltage drop component elements of the first emitter follower output circuit define a third switching control node at lower potential than the first switching control node coupled to the base node of the Miller killer transistor element for switching the Miller killer transistor element in phase with the voltage amplifier transistor element. The Miller killer transistor element further improves the slew rate at the TTL output.

Other objects, features and advantages of the invention are apparent in the following specification and accompanying drawings.

DESCRIPTION OF PREFERRED EXAMPLE EMBODIMENT AND BEST MODE OF THE INVENTION

Figure 1:
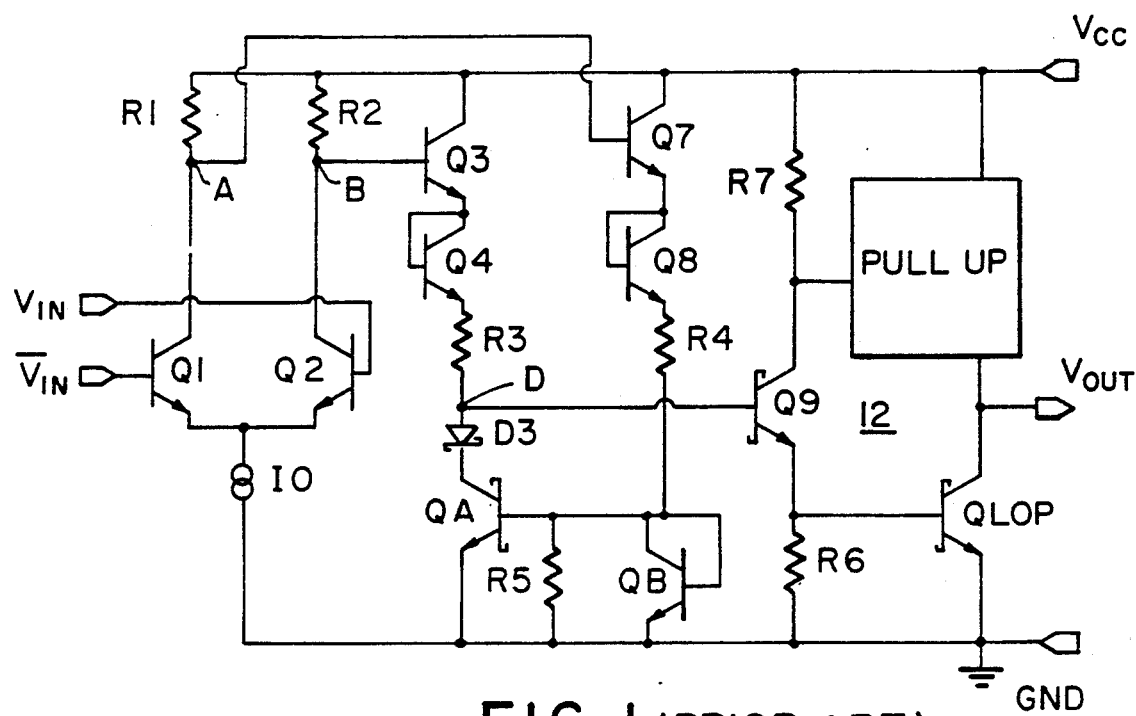
FIG. 1 is a schematic circuit diagram of a prior art ECL to TTL translator circuit in which translation is accomplished by a current mirror.
Figure 2:
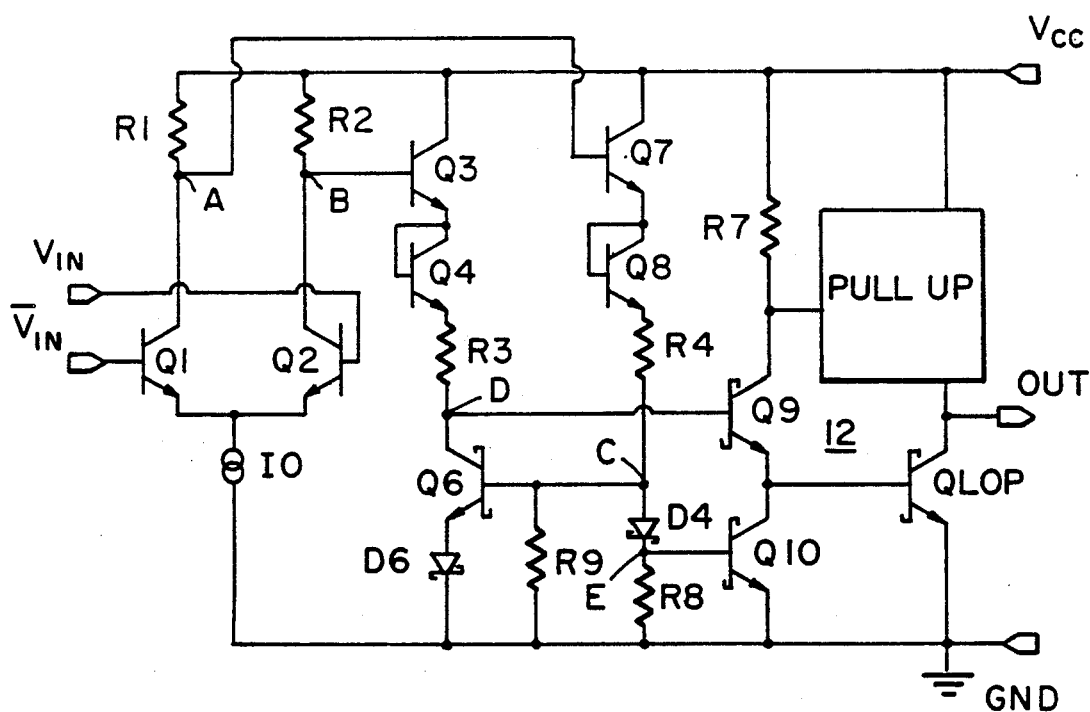
FIG. 2 is a schematic circuit diagram of an ECL to TTL translator circuit in which translation is accomplished by a voltage amplifier transistor element circuit according to the invention.

An ECL to TTL translator circuit according to the present invention is illustrated in FIG. 2. Circuit components performing the same or similar function as the components of the circuit of FIG. 1 are designated by the same reference designations. In the circuit of FIG. 2 the current mirror circuit coupling between the first and second emitter follower output circuits has been replaced. In the first emitter follower output circuit additional voltage drop components D4 and R8 have replaced the first current mirror transistor element branch circuit QB in the first stack of voltage drop component elements. A first switching control node C is established between voltage drop component elements R4 and D4. A third switching control node E is also established between voltage drop component elements D4 and R8 as hereafter described.

In the second emitter follower output circuit the second current mirror branch circuit transistor element QA and collector node Schottky diode transistor element D3 have been replaced by the voltage amplifier transistor element Q6 with emitter node Schottky diode element D6. Bleed resistor R9 is coupled between the base node of Q6 and low potential power rail GND. The second stack of voltage drop component elements establish a second switching control node D at the collector node of voltage amplifier transistor element Q6. The second switching control node D at the collector node of voltage amplifier transistor element Q6 is coupled to the base node of the phase splitter transistor element Q9 for controlling the conducting state of the phase splitter transistor element out of phase with the voltage amplifier transistor element. As shown in FIG. 2 the first emitter follower output circuit incorporating the first stack of voltage drop component elements Q7,Q8,R4,D4,R8 is coupled at switching control node C to the base node of voltage amplifier transistor element Q6. The second emitter follower output circuit incorporating the second stack of voltage drop component elements Q3,Q4,R3,Q6,D6 is coupled at the second switching control node D and the collector node of voltage amplifier transistor element Q6 to the base node of phase splitter transistor element Q9. The first and second emitter follower output circuits therefore cooperate to control the conducting state of the voltage amplifier transistor element in accordance with ECL input signals at the ECL input $V_{IN}$.

In the circuit example of FIG. 2 an ECL low potential level input signal at the input $V_{IN}$ results in a high potential level signal at the second switching control node D in the second emitter follower output circuit. In response to the low potential level signal at the input $V_{IN}$ the second emitter follower transistor element Q3 and second emitter follower output circuit pullup the voltage level at node D. At the same time the first emitter follower transistor element Q7 and first emitter follower output circuit effectively turn off, turning off the voltage amplifier transistor element Q6 so that it no longer sinks current from node D. The values of the voltage drop component elements of the first and second stacks of the respective first and second emitter follower output circuits are selected to establish at the second switching control node D a high potential level signal $\geq 2V_{be}$ above the low power rail GND. The high potential level signal at node D turns on the phase splitter transistor element Q9 and lower output pulldown translator element QLOP, pulling down the TTL output $V_{OUT}$ to the TTL low potential level.

For an ECL high potential level signal at the input $V_{IN}$ the second stack of voltage drop components in the second emitter follower output circuit no longer pulls up on the second switching control node D. At the same time the first emitter follower output circuit becomes conducting pulling up the first switching control node C and driving the base of the voltage amplifier transistor element Q6. The voltage amplifier transistor element Q6 pulls down the second switching control node D sinking current from the base of phase splitter element Q9. The values of the voltage drop component elements of the first and second stacks are selected so that the low potential level signal at the second switching control node D is $<2V_{be}$ above the low potential power rail GND so that the phase splitter transistor element Q9 and lower output pulldown transistor element QLOP turn off. The TTL output gate pullup therefore sources a TTL high potential level output signal at the TTL output $V_{OUT}$. It is apparent that with voltage amplifier transistor element Q6 conducting through Schottky transistor element D6, the low potential level at node D is $1V_{SAT}+1V_{SD}$ or approximately $1V_{be}$.

At node C the values of the voltage drop components in the first and second stacks establish a high potential level signal $\geq 1V_{be}+1V_{SD}$ above the low potential power rail GND. On the other hand when the first emitter follower output circuit is not conducting, or delivering only the low magnitude current, the low potential level at node C is $<1V_{be}+1V_{SD}$ for switching off the voltage amplifier transistor element Q6.

The circuit of FIG. 2 also incorporates a Miller killer transistor element Q10 having collector and emitter nodes coupled between the base node of lower output pulldown transistor element QLOP and the low potential power rail GND. The first stack of voltage drop component elements of the first emitter follower output circuit establishes a third switching control node E between D4 and R8 which is $1V_{SD}$ below the potential at the first switching control node C. The third switching control node E is coupled to the base node of the Miller killer transistor element Q10 for switching Q10 in phase with voltage amplifier transistor element Q6. The values of the voltage drop component elements are selected so that the high potential level signal at the third switching control node E is $\geq 1V_{be}$ above the low potential power rail so that Q10 is conducting at the same time as Q6 for sinking feedback Miller current from the base of QLOP. The low potential level at the third switching control node E is $<1V_{be}$ above the low potential power rail GND for switching off the Miller killer transistor element Q10 in phase with Q6.

Figure 3:
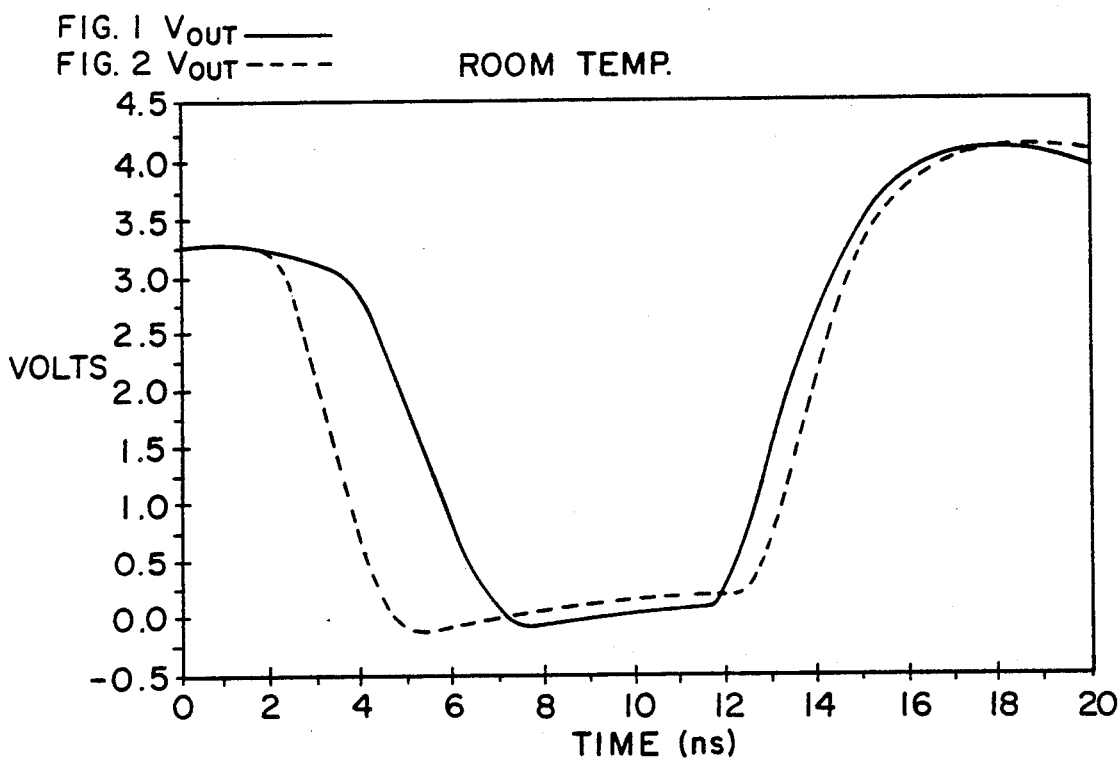
FIGS. 3 and 4 are plots comparing the output transient response of the ECL to TTL translator circuits of FIGS. 1 and 2 and showing the improved output transient response of the ECL to TTL translator circuit of the present invention at both room temperature and "worst case" high temperature of 125° C.
Figure 4:
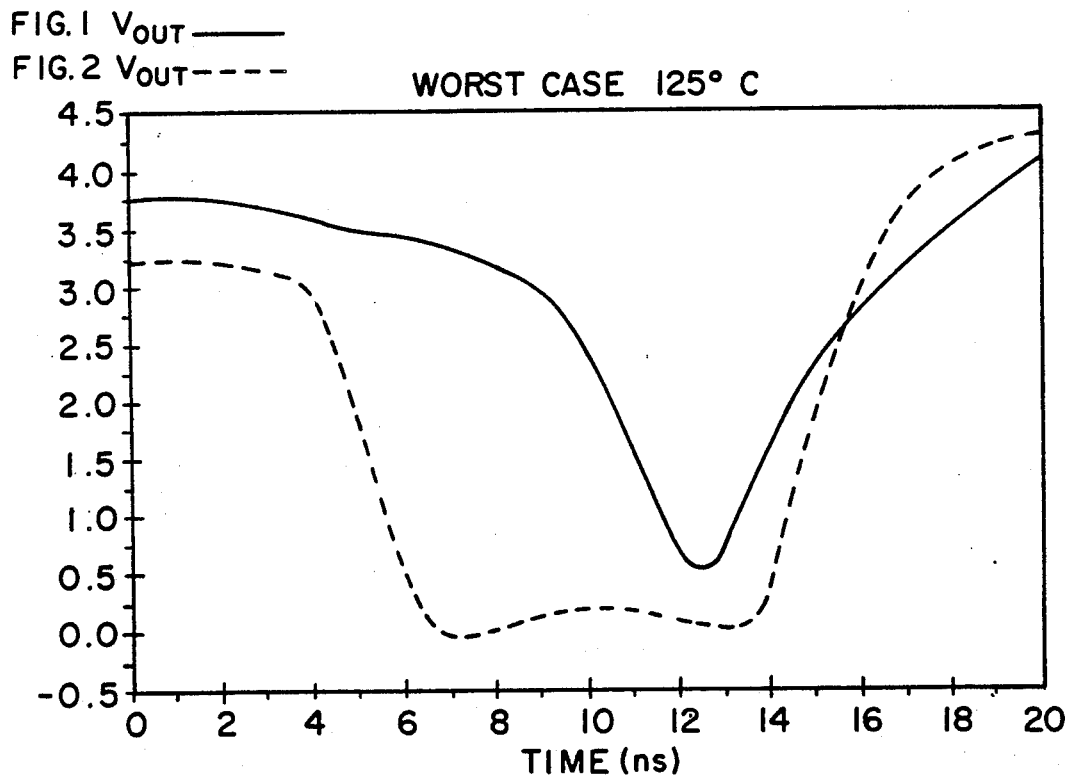

Thus for an ECL high potential level signal at the ECL input $V_{IN}$ a low potential level signal appears at node D while high potential level signals appear at nodes C and E. With an ECL low potential level signal at the ECL input $V_{IN}$, the high potential level signal appears at node D while low potential level signals appear at nodes C and E. Voltage amplifier transistor element Q6 is therefore controlled by the first and second emitter follower output circuits for effecting the ECL to TTL translation with enhanced speed. The improved output characteristics of the circuit of FIG. 2 in comparison with the prior art circuit of FIG. 1 are illustrated in the graphs of FIG. 3 at room temperature and FIG. 4 at 125° C.

Figure 2A:
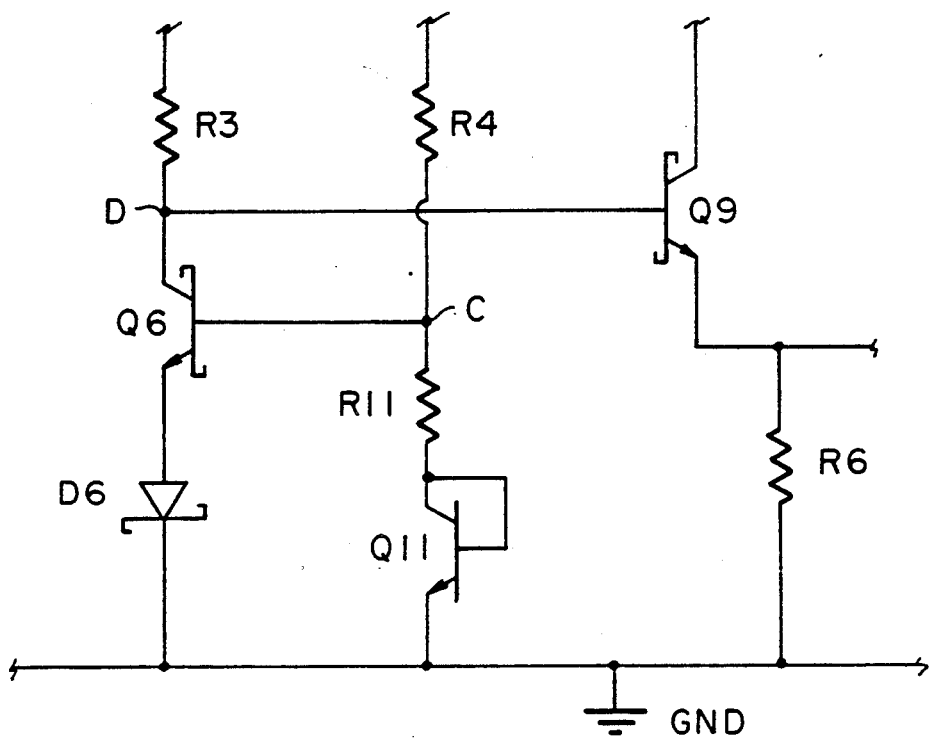
FIG. 2A is a detailed fragmentary schematic circuit diagram showing an alternative simplified embodiment of the translator circuit.

A simplification of the translator circuit of FIG. 2 with the Miller killer transistor element Q10 removed is illustrated in FIG. 2A. Circuit components performing the same or similar function are designated by the same reference designations. With the Miller killer transistor element Q10 removed the voltage drop component elements D4 and R8 establishing the third switching control node E are also removed. In their place voltage drop component elements R11 and Q11 are coupled between the first switching control node C and the low potential power rail GND for maintaining the desired potential levels at node C as heretofore described. While the invention has been described with reference to particular example embodiments it is intended to cover all modifications and equivalents within the scope of the following claims.

I claim:

1. An ECL to TTL translator circuit comprising:
   an ECL gate having differential ECL inputs for receiving ECL input signals of high and low potential levels at least at one of the ECL inputs ($V_{IN}$), and differential first and second ECL output nodes (A,B);
   first and second emitter follower output circuits coupled to the respective first and second ECL output nodes;
   a TTL gate (12) having a TTL output ($V_{OUT}$) for delivering TTL output signals corresponding to ECL input signals received at least at one of the ECL inputs;
   said TTL gate having a phase splitter transistor element (Q9) coupled in the TTL gate (12) to control the TTL output ($V_{OUT}$) according to the conducting state of the phase splitter transistor element;
   and a voltage amplifier transistor element (Q6) having a collector node coupled to a base node of the phase splitter transistor element (Q9) for controlling the conducting state of the phase splitter transistor element out of phase with the voltage amplifier transistor element;
   said first emitter follower output circuit being coupled to a base node of the voltage amplifier transistor element (Q6) and said second emitter follower output circuit being coupled to the collector node of the voltage amplifier transistor element (Q6) for switching on and off the voltage amplifier transistor element in accordance with ECL input signals;
   the base node of the voltage amplifier transistor element (Q6) being coupled to a low potential power rail (GND) through voltage drop component means including a resistor (R8,R11) for variable control of the voltage level at said base node.

2. The ECL to TTL translator circuit of claim 1 wherein the first emitter follower output circuit comprises a first stack of voltage drop component elements (Q7,Q8,R4,D4,R8) defining a first switching control node (C) coupled to the base node of the voltage amplifier transistor element (Q6), said first switching control node (C) being coupled to the low potential power rail (GND) through said resistor (R8,R11) for variable control of the voltage level at said first switching control node (C).

3. The ECL to TTL translator of claim 2 wherein the second emitter follower output circuit comprises a second stack of voltage drop component elements (Q3,Q4,R3,Q6,D6), said voltage amplifier transistor element (Q6) having collector and emitter nodes coupled in the second stack, said second stack of voltage drop component elements defining at the collector node of the voltage amplifier transistor element (Q6) a second switching control node (D) coupled to the base node of the phase splitter transistor element (Q9).

4. The TTL to ECL translator circuit of claim 3 wherein the translator circuit is coupled between high and low potential power rails, wherein the TTL gate (12) comprises a lower output pulldown transistor element (QLOP) having base and emitter nodes coupled between an emitter node of the phase splitter transistor element (Q9) and the low potential power rail, and wherein the first and second stacks of the first and second emitter follower output circuits comprise voltage drop component elements selected to establish at the second switching control node (D) a high potential level signal $>2V_{be}$ above the low potential power rail (GND), and a low potential level signal $<2V_{be}$ above the low potential power rail (GND) according to the ECL input signals at least at one of the differential ECL inputs for switching the phase splitter transistor element on and off.

5. The ECL to TTL translator circuit of claim 4 wherein the voltage drop component elements of the second stack comprise a Schottky diode (D6) coupled between the emitter node of the voltage amplifier transistor element (Q6) and the low potential power rail and wherein the voltage drop component elements of the first voltage stack are selected to establish at the first switching control node (C) a high potential level signal $>1V_{BE}+1V_{SD}$ above the low potential power rail and a low potential level signal $<1V_{BE}+1V_{SD}$ above the low potential power rail in response to the ECL input signals at least at one of the differential ECL inputs for switching the voltage amplifier transistor element (Q6) on and off.

6. The ECL to TTL translator circuit of claim 4 further comprising a Miller killer transistor element (Q10) having collector and emitter nodes coupled between the base node of the lower output pulldown transistor element (QLOP) and the low potential power rail, said first stack of voltage drop components of the first emitter follower output circuit defining a third switching control node (E) at lower potential than the first switching control node (C) and separated from the first switching control node (C) by a voltage drop component (D4), said third switching control node (E) being coupled to the base node of the Miller killer transistor element (Q10) for switching the Miller killer translator element on and off in phase with the voltage amplifier transistor element (Q6).

7. The ECL to TTL translator circuit of claim 6 wherein the first (C) and third (E) switching control nodes are separated in the first stack by a diode element (D4) and wherein the third switching control node (E) is coupled to the low potential power rail (GND) through said resistor (R8).

8. The ECL to TTL translator circuit of claim 6 wherein the voltage drop component elements of the first stack are selected to establish at the third switching control node (E) a high potential level signal $>1V_{be}$ above the low potential power rail and a low potential level $<1V_{be}$ above the low potential power rail in response to ECL input signals at least at one of the differential ECL inputs for switching on and off the Miller killer transistor element (Q10) in phase with the voltage amplifier transistor element (Q6).

9. The ECL to TTL translator circuit of claim 3 wherein the TTL gate (12) comprises a lower output pulldown transistor element (QLOP) having base and emitter nodes coupled between an emitter node of the phase splitter transistor element (Q9) and a low potential power rail, and further comprising a Miller killer transistor element (Q10) having collector and emitter nodes coupled between the base node of the lower output pulldown transistor element (QLOP) and the low potential power rail, said first emitter follower output circuit first stack of voltage drop component elements defining a third switching control node (E) at lower potential than the first switching control node (C) and separated from the first switching control node (C) by a voltage drop component (D4), said third switching control node (E) being coupled to a base node of the Miller killer transistor element (Q10).

10. The ECL to TTL translator circuit of claim 9 wherein the first (C) and third (E) switching control nodes are separated by a Schottky diode voltage drop component element (D4) and wherein the third switching control node (E) is coupled to a low potential power rail (GND) through said resistor (R8).

11. The TTL to ECL translator circuit of claim 9 wherein the voltage drop component elements of the first and second stacks are selected to establish at the third control node (E) a high potential level signal $>1V_{be}$ above the low potential power rail and a low potential level $<1V_{be}$ above the low potential power rail in response to ECL input signals at least at one of the ECL inputs for switching on and off the Miller killer transistor element (Q10).

12. An ECL to TTL translator circuit having an ECL input gate (Q1,Q2) with differential ECL inputs ($V_{in}$, $V_{in}$) for receiving ECL input signals, and differential first and second ECL output nodes (A,B), first and second emitter follower output circuits (Q3, Q7) respectively coupled to the first and second ECL output nodes (A,B), a TTL gate (12) having a TTL output ($V_{out}$) for delivering TTL output signals corresponding to ECL input signals at least at one of the ECL inputs ($V_{in}$, $V_{in}$), said TTL gate (12) having a phase splitter transistor element (Q9) coupled to control the TTL output according to the conducting state of the phase splitter transistor element the improvement comprising:

said second emitter follower output circuit (Q3) comprising a second stack of voltage drop component elements (Q4,R3,Q6,D3), including a voltage amplifier transistor element (Q6) having collector and emitter nodes coupled in the second stack;

said first emitter follower output circuit (Q7) comprising a first stack of voltage drop component elements (Q8,R4,D4,R8), (Q8, R4, R11, Q11) defining a first switching control node (C), said first switching control node (C) being coupled to a base node of the voltage amplifier transistor element (Q6) in the second emitter follower output circuit for switching on and off the voltage amplifier transistor element (Q6), said first switching control node (C) being coupled to a low potential power rail (GND) by voltage drop components of the first stack including a resistor (R8,R11) for variable control of the voltage level at said first switching control node (C);

the collector node of the voltage amplifier transistor element (Q6) forming a second control node (D) in the second emitter follower output circuit coupled to the base node of the phase splitter transistor element (Q9) for switching on and off the phase splitter transistor element (Q9) out of phase with the voltage amplifier transistor element (Q6).

13. The TTL to ECL translator circuit of claim 12 wherein the translator circuit is coupled between high and low potential power rails, wherein the TTL gate (12) comprises a lower output pulldown transistor element (QLOP) having base and emitter nodes coupled between an emitter node of the phase splitter transistor element (Q9) and the low potential power rail, and wherein the first and second stacks of the first and second emitter follower output circuits comprise voltage drop component elements selected to establish at the second control node (D) a high potential level signal $>2V_{be}$ above the low potential power rail, and a low potential level signal $<2V_{be}$ above the low potential power rail according to the ECL input signals at the differential ECL inputs for switching the phase splitter transistor element on and off.

14. The ECL to TTL translator circuit of claim 13 wherein the voltage drop component elements of the second voltage drop stack comprise a Schottky diode (D6) couple between the emitter node of the voltage amplifier transistor element (Q6) and the low potential power rail and wherein the voltage drop component elements of the first voltage stack are selected to establish at the first switching control node (C) a high potential level signal $>1V_{BE}+1V_{SD}$ above the low potential power rail and a low potential level signal $<1V_{BE}+1V_{SD}$ above the low potential power rail in response to the ECL input signals at least at one of the differential ECL inputs for switching the voltage amplifier transistor element on and off.

15. The ECL to TTL translator circuit of claim 13 further comprising a Miller killer transistor element (Q10) having collector and emitter nodes coupled between the base node of the lower output pulldown transistor element (QLOP) and the low potential power rail, said first emitter follower output circuit defining a third switching control node (E) at lower potential then the first switching control node (C) and separated from the first switching control node (C) by a voltage drop component (D4), said third switching control node (E) being coupled to the base node of the Miller killer transistor element for switching the Miller killer transistor element (Q10) on and off in phase with the voltage amplifier transistor element (Q6), said third switching control node (E) being coupled to the low potential power rail (GND) through said resistor (R8,R11).

16. The ECL to TTL translator circuit of claim 15 wherein the voltage drop component elements of the first stack are selected to establish at the third switching control node (E) a high potential level signal $>1V_{be}$ above the low potential power rail and a low potential level $<1V_{be}$ above the low potential power rail in response to ECL input signals at least at one of the differential ECL inputs for switching on and off the Miller killer transistor element (Q10) in phase with the voltage amplifier transistor element (Q6).

* * * * *